United States Patent
Jiang et al.

(10) Patent No.: US 11,738,771 B2
(45) Date of Patent: Aug. 29, 2023

(54) DYNAMIC MODEL WITH ACTUATION LATENCY

(71) Applicants: Baidu.com Times Technology (Beijing) Co., Ltd., Beijing (CN); Baidu USA LLC, Sunnyvale, CA (US)

(72) Inventors: Shu Jiang, Sunnyvale, CA (US); Qi Luo, Sunnyvale, CA (US); Jinghao Miao, Sunnyvale, CA (US); Jiangtao Hu, Sunnyvale, CA (US); Yu Wang, Sunnyvale, CA (US); Jiaxuan Xu, Sunnyvale, CA (US); Jinyun Zhou, Sunnyvale, CA (US); Kuang Hu, Beijing (CN); Chao Ma, Beijing (CN)

(73) Assignees: BAIDU USA LLC, Sunnyvale, CA (US); BAIDU.COM TIMES TECHNOLOGY (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/627,257

(22) PCT Filed: Dec. 20, 2019

(86) PCT No.: PCT/CN2019/127125
§ 371 (c)(1),
(2) Date: Dec. 27, 2019

(87) PCT Pub. No.: WO2021/120201
PCT Pub. Date: Jun. 24, 2021

(65) Prior Publication Data
US 2022/0315046 A1  Oct. 6, 2022

(51) Int. Cl.
*B60W 60/00* (2020.01)
*G06F 30/27* (2020.01)
(Continued)

(52) U.S. Cl.
CPC ........ *B60W 60/0011* (2020.02); *B60W 10/06* (2013.01); *B60W 10/18* (2013.01); *B60W 10/20* (2013.01)

(58) Field of Classification Search
CPC ...... B60W 10/06; B60W 10/18; B60W 10/20; B60W 60/0011; G06F 30/27
See application file for complete search history.

(56) References Cited

U.S. PATENT DOCUMENTS

2018/0086351 A1   3/2018   Zhu et al.

FOREIGN PATENT DOCUMENTS

| CN | 103514316 A | 1/2014 |
| CN | 108099918 A | 6/2018 |

(Continued)

OTHER PUBLICATIONS

Alonzo Kelly et al: "Rough Terrain Autonomous Mobility—Part 2: An Active Vision, predictive Control Approach", Autonomous Robots, Kluwer Academic Publishers, Dordrecht, NL, May 1, 1998, 36 pages.

(Continued)

*Primary Examiner* — Tisha D Lewis
(74) *Attorney, Agent, or Firm* — Womble Bond Dickinson (US) LLP

(57) ABSTRACT

A simulation of an autonomous driving vehicle (ADV) includes capturing first data that includes a control command output by an autonomous vehicle controller of the ADV, and capturing second data that includes the control command being implemented at a control unit of the ADV. The control command, for example, a steering command, a braking command, or a throttle command, is implemented by the ADV to affect movement of the ADV. A latency model is determined based on comparing the first data with the second data, where the latency model defines time delay (Continued)

and/or amplitude difference between the first data and the second data. The latency model is applied in a virtual driving environment.

20 Claims, 10 Drawing Sheets

(51) Int. Cl.
*B60W 10/06* (2006.01)
*B60W 10/18* (2012.01)
*B60W 10/20* (2006.01)

(56) References Cited

FOREIGN PATENT DOCUMENTS

| CN | 108803607 A | 11/2018 | |
|---|---|---|---|
| CN | 108958233 A | 12/2018 | |
| CN | 109884916 A | 6/2019 | |
| WO | WO-2018211488 A1 * | 11/2018 | ........ B60W 60/0011 |
| WO | 2019009114 A | 1/2019 | |

OTHER PUBLICATIONS

Zheng Bowen et al: "Next Generation Automotive Architecture Modeling and Exploration for Autonomous Driving", 2016 IEEE Computer Society Annual Symposium On VLSI, Jul. 11, 2016, 6 pages.

Jie Tan et al: "Sim-to-Real: Learning Agile Locomotion For Quadruped Robots", Arxiv.org, Cornell University Library, Apr. 27, 2018, 11 pages.

Gelbal, Sukru Yaren et al: "A Connected and autonomous vehicle hardware-in-the-loop simulator for developing automated driving algorithms", 2017 IEEE International Conference on Systems, Man, and Cybernetics (SMC), Oct. 5, 2017, 6 Pages.

* cited by examiner

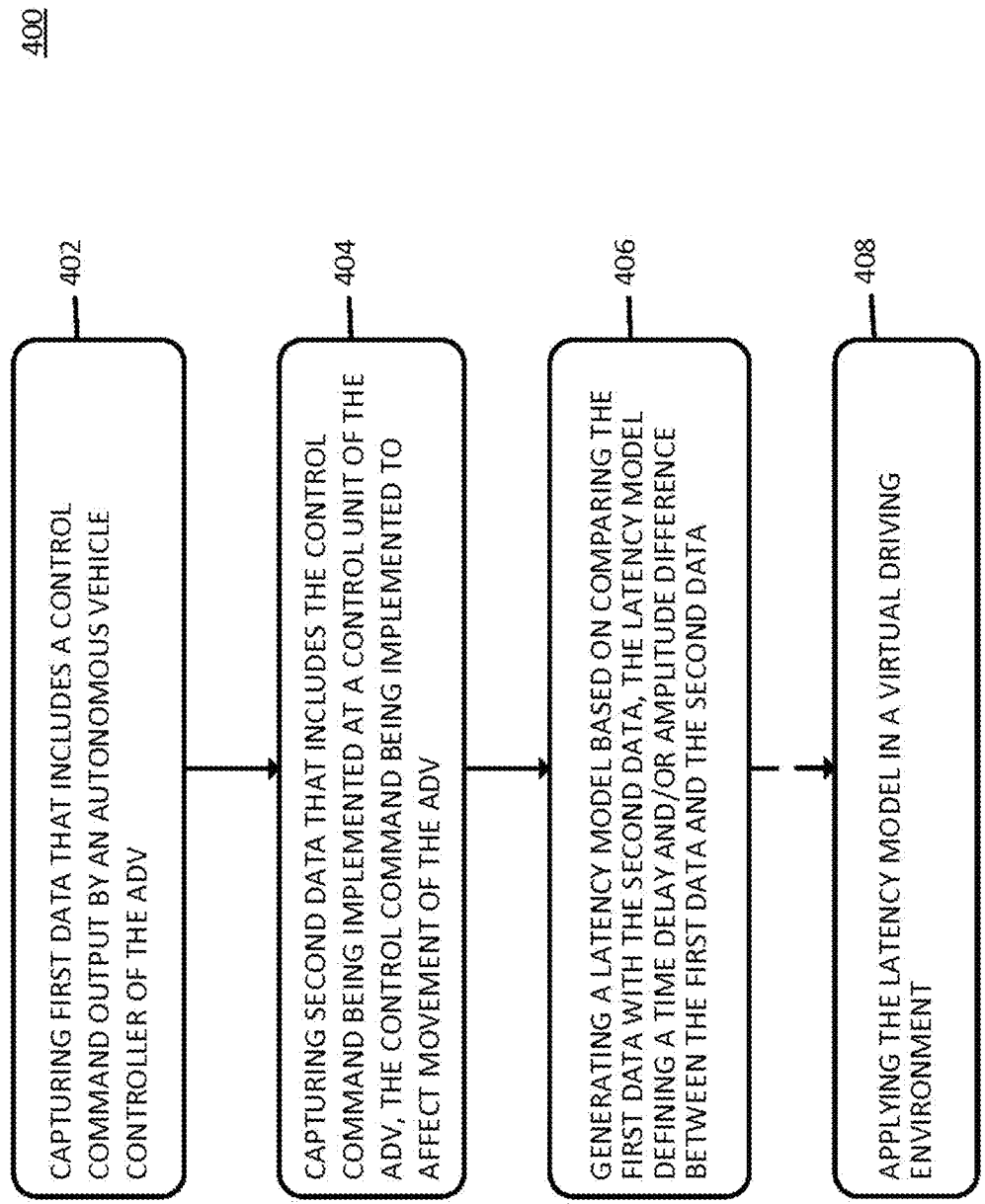

DYNAMIC MODEL WITH ACTUATION LATENCY

TECHNICAL FIELD

Embodiments of the present disclosure relate generally to operating autonomous vehicles. More particularly, embodiments of the disclosure relate to determining actuation latency of an ADV and simulating a dynamic model with the actuation latency.

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

Motion planning and control are critical operations in autonomous driving. However, conventional motion planning operations estimate the difficulty of completing a given path mainly from its curvature and speed, without considering the differences in features for different types of vehicles. Same motion planning and control is applied to all types of vehicles, which may not be accurate and smooth under some circumstances.

Vehicles controls of an autonomous driving vehicle (ADV), for example, steering, braking, and throttle commands, can have a latency from a point that the command is given by a vehicle controller, to a point that the command is responded to by the ADV.

A simulation, generated by a data processing device (e.g., a computer), can model movement and interactions of physical objects in a virtual environment. For example, a virtual environment can have virtual roads, virtual vehicles (including the ADV), virtual pedestrians, virtual buildings, and other virtual objects. Control inputs (e.g., throttle, steering, and braking) can be applied to a virtual vehicle to control movement of the vehicle in the virtual environment. In the simulation, the control input can be applied to objects such as an ADV without delay or dampening. In the physical world, however, and ADV control command can have latency.

SUMMARY

In a first aspect, a method for simulating driving of an autonomous driving vehicle (ADV) is provided. The method includes capturing first data that includes a control command output by an autonomous vehicle controller of the ADV and timing of outputting the control command, wherein the control command was generated using an autonomous driving algorithm; capturing second data that includes the control command being implemented at a control unit of the ADV and timing of the implementation, the control command being implemented to affect movement of the ADV; and determining a latency model based on comparing at least timing of the first data with the second data, the latency model defining time delay between the first data and the second data, wherein the latency model is utilized to simulate the autonomous driving algorithm in a virtual driving environment.

In a second aspect, a data processing system is provided. The system includes one or more processors; and memory coupled to the one or more processors to store instructions, which when executed by the one or more processors, cause the one or more processors to perform operations including capturing first data that includes a control command output by an autonomous vehicle controller of the ADV and timing of outputting the control command, wherein the control command was generated using an autonomous driving algorithm; capturing second data that includes the control command being implemented at a control unit of the ADV and timing of the implementation, the control command being implemented to affect movement of the ADV; and determining a latency model based on comparing at least timing of the first data with the second data, the latency model defining time delay between the first data and the second data, wherein the latency model is utilized to simulate the autonomous driving algorithm in a virtual driving environment.

In a third aspect, a non-transitory machine-readable medium having instructions stored therein is provided. The instructions, when executed by a processor, cause the processor to perform operations including: capturing first data that includes a control command output by an autonomous vehicle controller of the ADV and timing of outputting the control command, wherein the control command was generated using an autonomous driving algorithm; capturing second data that includes the control command being implemented at a control unit of the ADV and timing of the implementation, the control command being implemented to affect movement of the ADV; and determining a latency model based on comparing at least timing of the first data with the second data, the latency model defining time delay between the first data and the second data, wherein the latency model is utilized to simulate the autonomous driving algorithm in a virtual driving environment.

BRIEF DESCRIPTION OF THE DRAWINGS

Embodiments of the disclosure are illustrated by way of example and not limitation in the figures of the accompanying drawings in which like references indicate similar elements.

FIG. 4 shows a process for simulating an ADV using a latency model according to one embodiment.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

In the physical world, there can be time delay, as well as some dampening of a control command, between a point where the control command is issued, a point where the control command is received, and/or an implementation of the control command (a response of a control unit of the ADV to the control command). Simulation of ADV in a virtual environment is especially helpful, to simulate how different control algorithms will play out in the real world, while minimizing risk of damage or harm.

For example, to simulate how one or more of the ADV's driving modules and algorithms might respond to a pedestrian that steps out into the road, a virtual environment can be generated with a virtual ADV to test such a scenario. The modules and algorithms of the virtual ADV can sense the virtual pedestrian and try to brake. A virtual steering command can be generated and applied to the virtual ADV to simulate whether the virtual ADV will respond sufficiently. To more closely resemble the physical world, a latency model can be applied to the steering command. The latency model can be determined based on data captured in a physical ADV, thereby "bridging the gap" by bringing realistic time delays and dampening of a physical ADV into a virtual ADV in the virtual environment.

According to some embodiments, a latency model is determined based on a) captured control command data of ADV module, and b) captured data on the chassis of the ADV. The latency model includes time delay and/or dampening of the control command. In other words, the latency model can define a sensed response of the ADV to the control command. This latency model is applied in a virtual environment to test and simulate ADV modules and algorithms.

Figure 1:
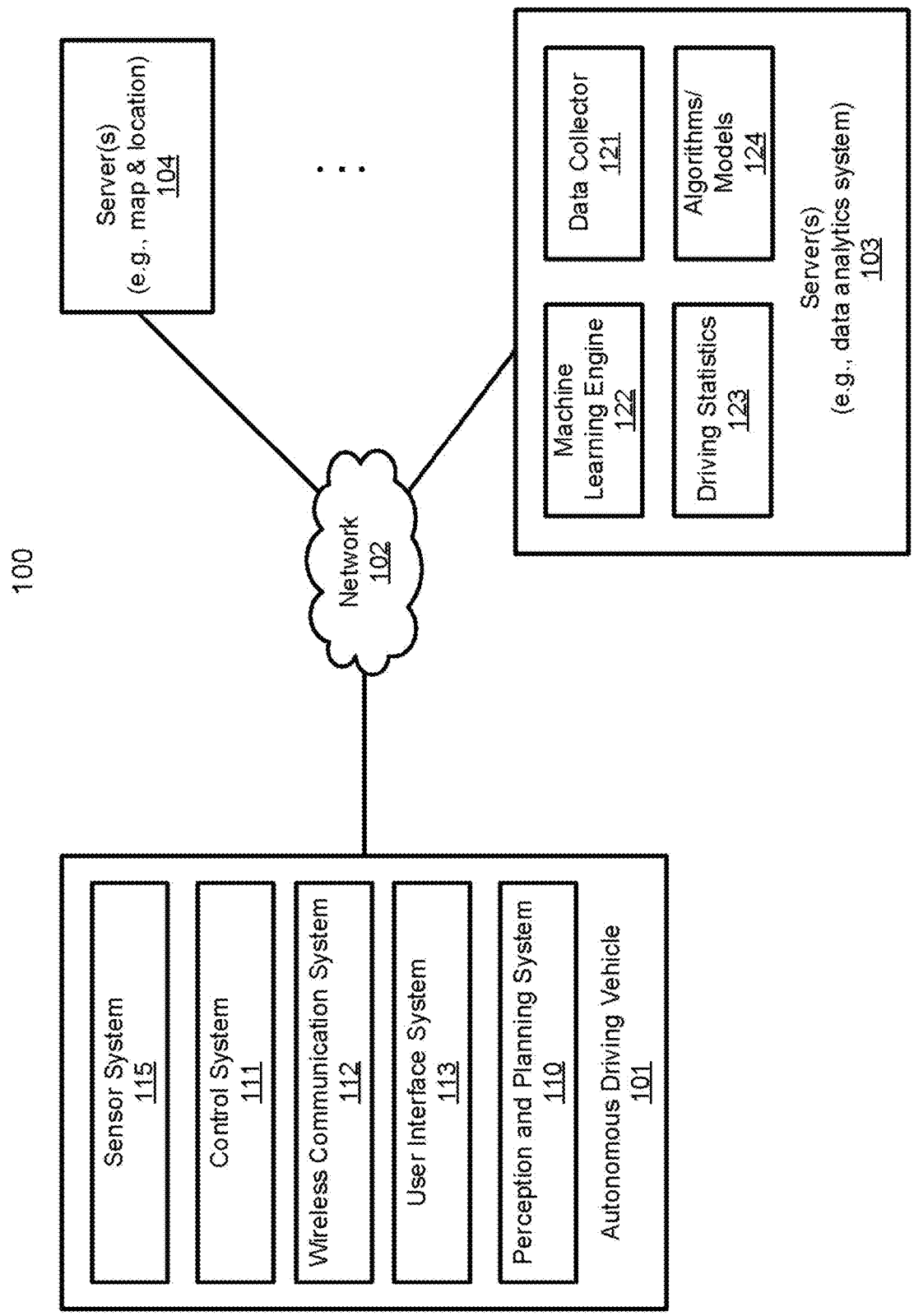
FIG. 1 is a block diagram illustrating a networked system according to one embodiment.

FIG. 1 is a block diagram illustrating an autonomous vehicle network configuration according to one embodiment of the disclosure. Referring to FIG. 1, network configuration 100 includes autonomous vehicle 101 that may be communicatively coupled to one or more servers 103-104 over a network 102. Although there is one autonomous vehicle shown, multiple autonomous vehicles can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) servers, or location servers, etc.

An autonomous vehicle refers to a vehicle that can be configured to in an autonomous mode in which the vehicle navigates through an environment with little or no input from a driver. Such an autonomous vehicle can include a sensor system having one or more sensors that are configured to detect information about the environment in which the vehicle operates. The vehicle and its associated controller(s) use the detected information to navigate through the environment. Autonomous vehicle 101 can operate in a manual mode, a full autonomous mode, or a partial autonomous mode.

In one embodiment, autonomous vehicle 101 includes, but is not limited to, perception and planning system 110, vehicle control system 111, wireless communication system 112, user interface system 113, and sensor system 115. Autonomous vehicle 101 may further include certain common components included in ordinary vehicles, such as, an engine, wheels, steering wheel, transmission, etc., which may be controlled by vehicle control system 111 and/or perception and planning system 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 2:
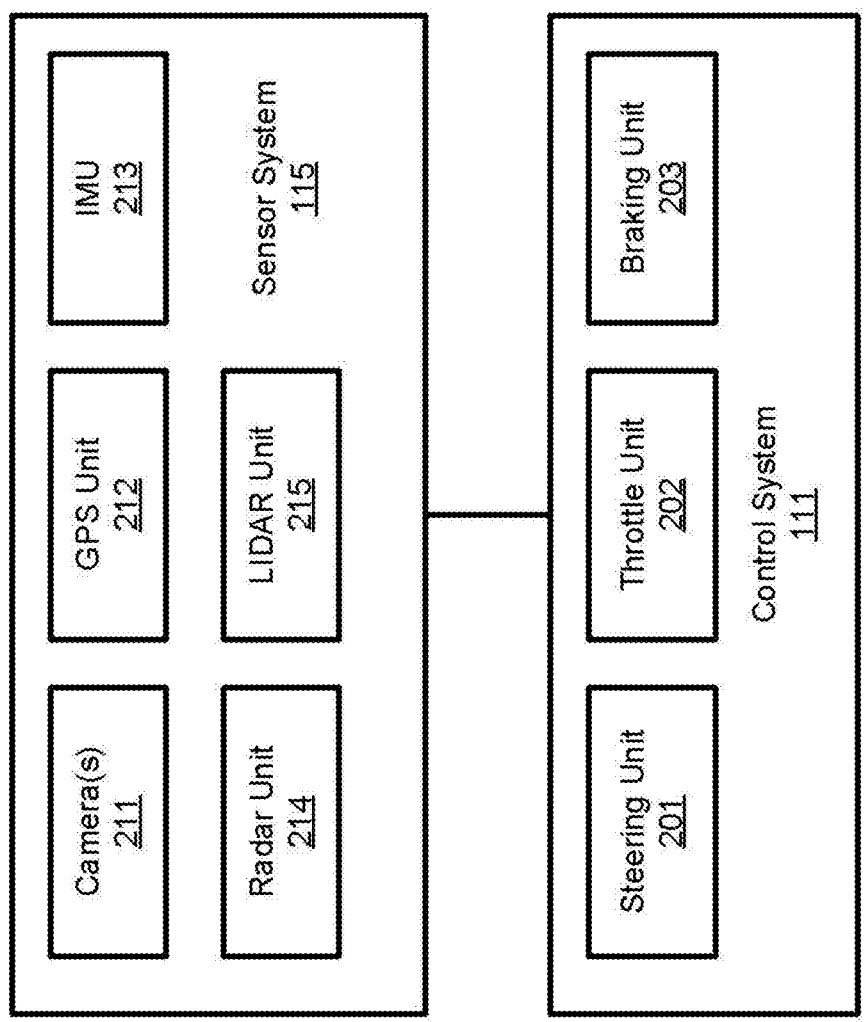
FIG. 2 is a block diagram illustrating an example of an autonomous vehicle according to one embodiment.

Referring now to FIG. 2, in one embodiment, sensor system 115 includes, but it is not limited to, one or more cameras 211, global positioning system (GPS) unit 212, inertial measurement unit (IMU) 213, radar unit 214, and a light detection and range (LIDAR) unit 215. GPS system 212 may include a transceiver operable to provide information regarding the position of the autonomous vehicle. IMU unit 213 may sense position and orientation changes of the autonomous vehicle based on inertial acceleration. Radar unit 214 may represent a system that utilizes radio signals to sense objects within the local environment of the autonomous vehicle. In some embodiments, in addition to sensing objects, radar unit 214 may additionally sense the speed and/or heading of the objects. LIDAR unit 215 may sense objects in the environment in which the autonomous vehicle is located using lasers. LIDAR unit 215 could include one or more laser sources, a laser scanner, and one or more detectors, among other system components. Cameras 211 may include one or more devices to capture images of the environment surrounding the autonomous vehicle. Cameras 211 may be still cameras and/or video cameras. A camera may be mechanically movable, for example, by mounting the camera on a rotating and/or tilting a platform.

Sensor system 115 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the autonomous vehicle. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 111 includes, but is not limited to, steering unit 201, throttle unit 202 (also referred to as an acceleration unit), and braking unit 203. Steering unit 201 is to adjust the direction or heading of the vehicle. Throttle unit 202 is to control the speed of the motor or engine that in turn controls the speed and acceleration of the vehicle. Braking unit 203 is to decelerate the vehicle by providing friction to slow the wheels or tires of the vehicle. Note that the components as shown in FIG. 2 may be implemented in hardware, software, or a combination thereof.

Referring back to FIG. 1, wireless communication system 112 is to allow communication between autonomous vehicle 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of autonomous vehicle 101 may be controlled or managed by perception and planning system 110, especially when operating in an autonomous driving mode. Perception and planning system 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, perception and planning system 110 may be integrated with vehicle control system 111.

For example, a user as a passenger may specify a starting location and a destination of a trip, for example, via a user interface. Perception and planning system 110 obtains the trip related data. For example, perception and planning system 110 may obtain location and route information from an MPOI server, which may be a part of servers 103-104. The location server provides location services and the MPOI server provides map services and the POIs of certain locations. Alternatively, such location and MPOI information may be cached locally in a persistent storage device of perception and planning system 110.

While autonomous vehicle 101 is moving along the route, perception and planning system 110 may also obtain real-time traffic information from a traffic information system or server (TIS). Note that servers 103-104 may be operated by a third party entity. Alternatively, the functionalities of servers 103-104 may be integrated with perception and planning system 110. Based on the real-time traffic information, MPOI information, and location information, as well as real-time local environment data detected or sensed by sensor system 115 (e.g., obstacles, objects, nearby vehicles), perception and planning system 110 can plan an optimal route and drive vehicle 101, for example, via control system 111, according to the planned route to reach the specified destination safely and efficiently.

Server 103 may be a data analytics system to perform data analytics services for a variety of clients. In one embodiment, data analytics system 103 includes data collector 121 and machine learning engine 122. Data collector 121 collects driving statistics 123 from a variety of vehicles, either autonomous vehicles or regular vehicles driven by human drivers. Driving statistics 123 include information indicating the driving commands (e.g., throttle, brake, steering commands) issued and responses of the vehicles (e.g., speeds, accelerations, decelerations, directions) captured by sensors of the vehicles at different points in time. Driving statistics 123 may further include information describing the driving environments at different points in time, such as, for example, routes (including starting and destination locations), MPOIs, road conditions, weather conditions, etc.

In one embodiment, driving statistics 123 may include a set of control commands issued at different times from an autonomous driving system and received or executed by the vehicle platforms of the vehicles such as an electronic control unit (ECU) of the vehicles. The latency or delay of timing between the commands issued by the autonomous driving system and the vehicle platform may occur and impact the planning and control of the autonomous driving system.

Based on driving statistics 123, machine learning engine 122 generates or trains a set of rules, algorithms, and/or predictive models 124 for a variety of purposes. In one embodiment, machine learning engine 122 may generate a latency model based on the driving statistics to determine the latency or delay in timing between the software (e.g., autonomous driving system) and the hardware (e.g., vehicle platform). For example, algorithms 124 may include a latency model that determines the latency of the vehicles or types of the vehicles generated based on the driving statistics. Algorithms 124 can then be uploaded on ADVs to be utilized during autonomous driving in real-time or in simulation of an autonomous driving system.

Figure 3A:
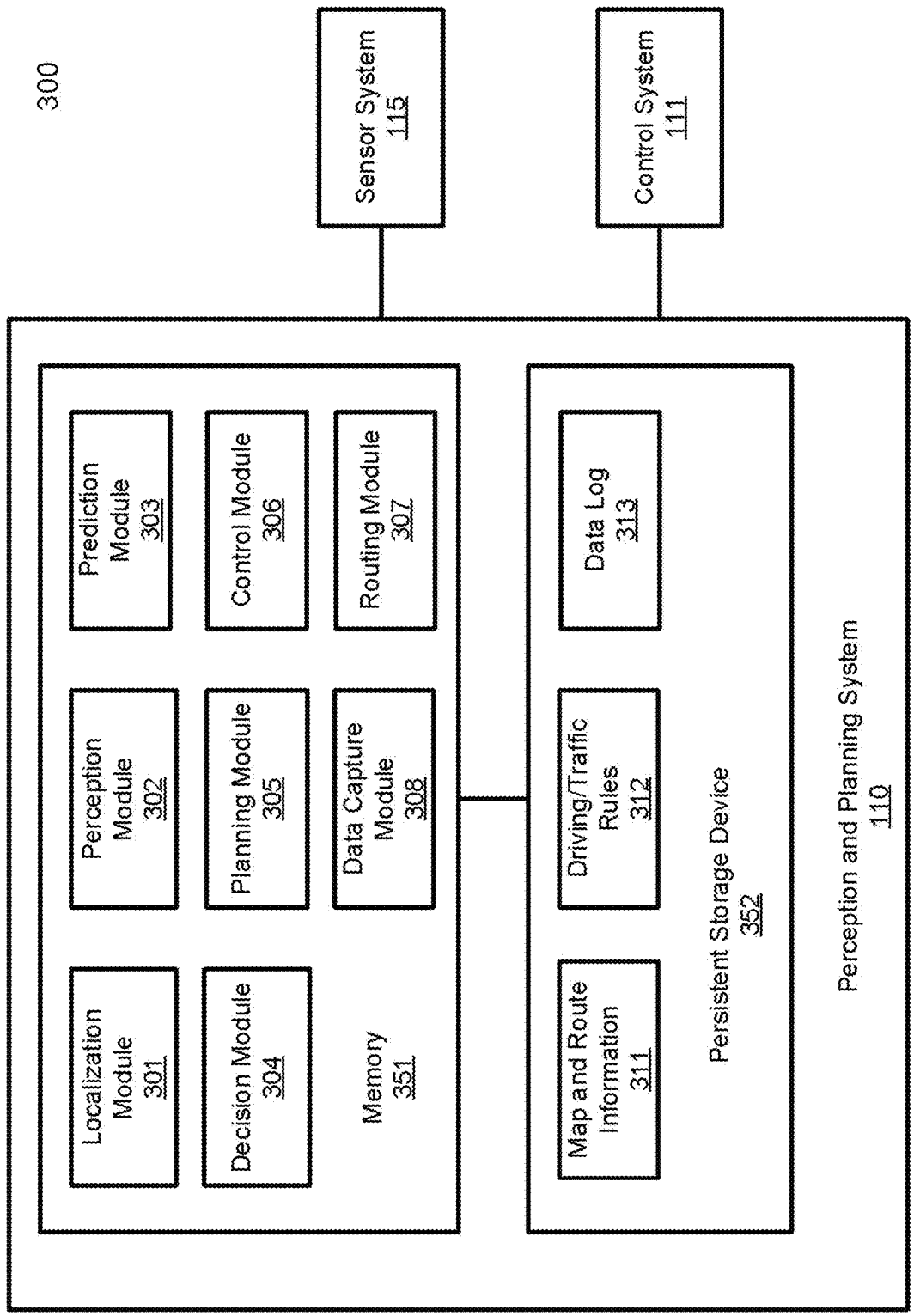
FIGS. 3A-3B are block diagrams illustrating an example of a perception and planning system used with an autonomous vehicle according to one embodiment.
Figure 3B:
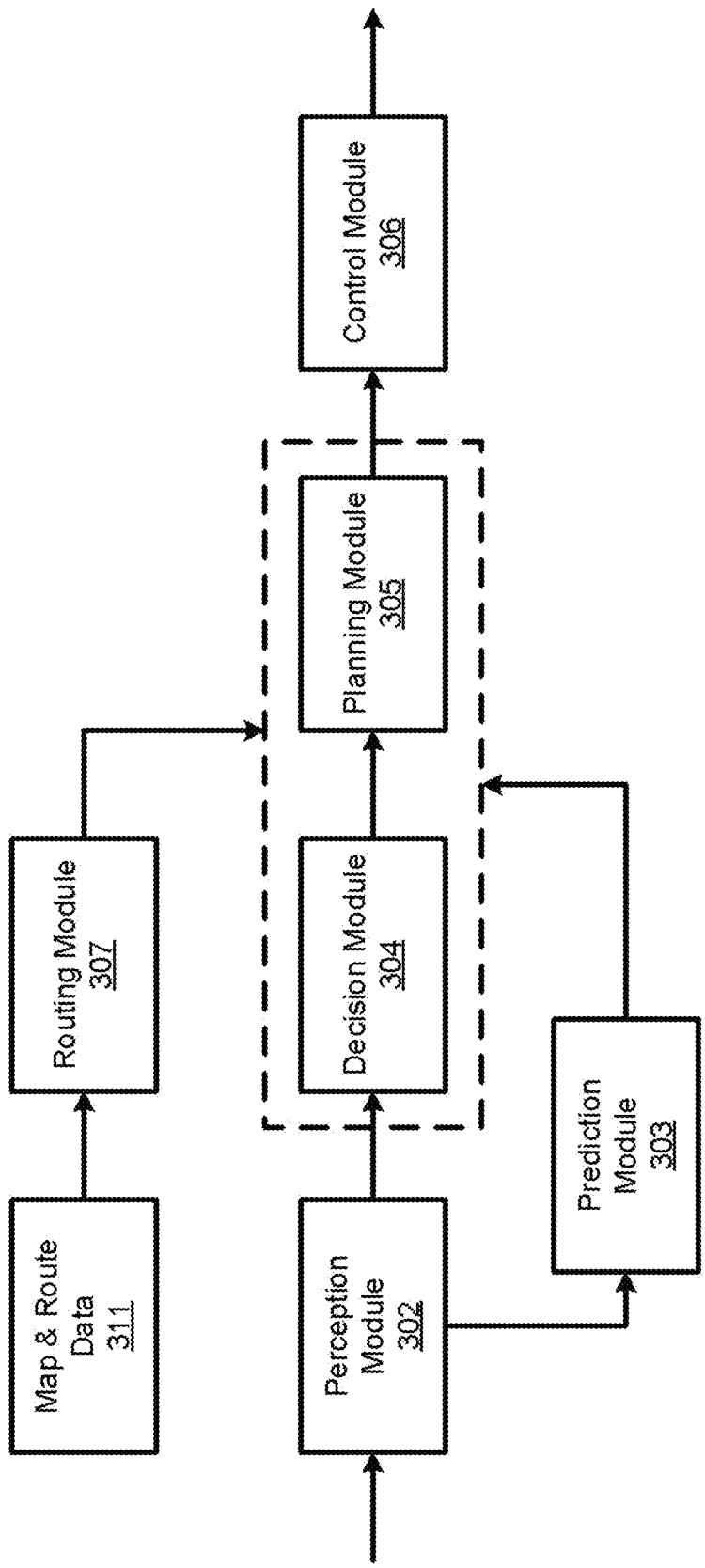

FIGS. 3A and 3B are block diagrams illustrating an example of a perception and planning system used with an autonomous vehicle according to one embodiment. System 300 may be implemented as a part of autonomous vehicle 101 of FIG. 1 including, but is not limited to, perception and planning system 110, control system 111, and sensor system 115. Referring to FIGS. 3A-3B, perception and planning system 110 includes, but is not limited to, localization module 301, perception module 302, prediction module 303, decision module 304, planning module 305, control module 306, routing module 307, and data capture module 308.

Some or all of modules 301-308 may be implemented in software, hardware, or a combination thereof. For example, these modules may be installed in persistent storage device 352, loaded into memory 351, and executed by one or more processors (not shown). Note that some or all of these modules may be communicatively coupled to or integrated with some or all modules of vehicle control system 111 of FIG. 2. Some of modules 301-308 may be integrated together as an integrated module.

Localization module 301 determines a current location of autonomous vehicle 300 (e.g., leveraging GPS unit 212) and manages any data related to a trip or route of a user. Localization module 301 (also referred to as a map and route module) manages any data related to a trip or route of a user. A user may log in and specify a starting location and a destination of a trip, for example, via a user interface. Localization module 301 communicates with other components of autonomous vehicle 300, such as map and route information 311, to obtain the trip related data. For example, localization module 301 may obtain location and route information from a location server and a map and POI (MPOI) server. A location server provides location services and an MPOI server provides map services and the POIs of certain locations, which may be cached as part of map and route information 311. While autonomous vehicle 300 is moving along the route, localization module 301 may also obtain real-time traffic information from a traffic information system or server.

Based on the sensor data provided by sensor system 115 and localization information obtained by localization module 301, a perception of the surrounding environment is determined by perception module 302. The perception information may represent what an ordinary driver would perceive surrounding a vehicle in which the driver is driving. The perception can include the lane configuration, traffic light signals, a relative position of another vehicle, a pedestrian, a building, crosswalk, or other traffic related signs (e.g., stop signs, yield signs), etc., for example, in a form of an object. The lane configuration includes information describing a lane or lanes, such as, for example, a shape of the lane (e.g., straight or curvature), a width of the lane, how many lanes in a road, one-way or two-way lane, merging or splitting lanes, exiting lane, etc.

Perception module 302 may include a computer vision system or functionalities of a computer vision system to process and analyze images captured by one or more cameras in order to identify objects and/or features in the environment of autonomous vehicle. The objects can include traffic signals, road way boundaries, other vehicles, pedestrians, and/or obstacles, etc. The computer vision system may use an object recognition algorithm, video tracking, and other computer vision techniques. In some embodiments, the computer vision system can map an environment, track objects, and estimate the speed of objects, etc. Perception module 302 can also detect objects based on other sensors data provided by other sensors such as a radar and/or LIDAR.

For each of the objects, prediction module 303 predicts what the object will behave under the circumstances. The prediction is performed based on the perception data perceiving the driving environment at the point in time in view of a set of map/rout information 311 and traffic rules 312. For example, if the object is a vehicle at an opposing direction and the current driving environment includes an intersection, prediction module 303 will predict whether the vehicle will likely move straight forward or make a turn. If the perception data indicates that the intersection has no traffic light, prediction module 303 may predict that the vehicle may have to fully stop prior to enter the intersection. If the perception data indicates that the vehicle is currently at a left-turn only lane or a right-turn only lane, prediction module 303 may predict that the vehicle will more likely make a left turn or right turn respectively.

For each of the objects, decision module 304 makes a decision regarding how to handle the object. For example, for a particular object (e.g., another vehicle in a crossing route) as well as its metadata describing the object (e.g., a speed, direction, turning angle), decision module 304 decides how to encounter the object (e.g., overtake, yield, stop, pass). Decision module 304 may make such decisions according to a set of rules such as traffic rules or driving rules 312, which may be stored in persistent storage device 352.

Routing module 307 is configured to provide one or more routes or paths from a starting point to a destination point. For a given trip from a start location to a destination location, for example, received from a user, routing module 307 obtains route and map information 311 and determines all possible routes or paths from the starting location to reach the destination location. Routing module 307 may generate a reference line in a form of a topographic map for each of the routes it determines from the starting location to reach the destination location. A reference line refers to an ideal route or path without any interference from others such as other vehicles, obstacles, or traffic condition. That is, if there is no other vehicle, pedestrians, or obstacles on the road, an ADV should exactly or closely follows the reference line. The topographic maps are then provided to decision module 304 and/or planning module 305. Decision module 304 and/or planning module 305 examine all of the possible routes to select and modify one of the most optimal routes in view of other data provided by other modules such as traffic conditions from localization module 301, driving environment perceived by perception module 302, and traffic condition predicted by prediction module 303. The actual path or route for controlling the ADV may be close to or different from the reference line provided by routing module 307 dependent upon the specific driving environment at the point in time.

Based on a decision for each of the objects perceived, planning module 305 plans a path or route for the autonomous vehicle, as well as driving parameters (e.g., distance, speed, and/or turning angle), using a reference line provided by routing module 307 as a basis. That is, for a given object, decision module 304 decides what to do with the object, while planning module 305 determines how to do it. For example, for a given object, decision module 304 may decide to pass the object, while planning module 305 may determine whether to pass on the left side or right side of the object. Planning and control data is generated by planning module 305 including information describing how vehicle 300 would move in a next moving cycle (e.g., next route/path segment). For example, the planning and control data may instruct vehicle 300 to move 10 meters at a speed of 30 miles per hour (mph), then change to a right lane at the speed of 25 mph.

Based on the planning and control data, control module 306 controls and drives the autonomous vehicle, by sending proper commands or signals to vehicle control system 111, according to a route or path defined by the planning and control data. The planning and control data include sufficient information to drive the vehicle from a first point to a second point of a route or path using appropriate vehicle settings or driving parameters (e.g., throttle, braking, steering commands) at different points in time along the path or route.

In one embodiment, the planning phase is performed in a number of planning cycles, also referred to as driving cycles, such as, for example, in every time interval of 100 milliseconds (ms). For each of the planning cycles or driving cycles, one or more control commands will be issued based on the planning and control data. That is, for every 100 ms, planning module 305 plans a next route segment or path segment, for example, including a target position and the time required for the ADV to reach the target position. Alternatively, planning module 305 may further specify the specific speed, direction, and/or steering angle, etc. In one embodiment, planning module 305 plans a route segment or path segment for the next predetermined period of time such as 5 seconds. For each planning cycle, planning module 305 plans a target position for the current cycle (e.g., next 5 seconds) based on a target position planned in a previous cycle. Control module 306 then generates one or more control commands (e.g., throttle, brake, steering control commands) based on the planning and control data of the current cycle.

Note that decision module 304 and planning module 305 may be integrated as an integrated module. Decision module 304/planning module 305 may include a navigation system or functionalities of a navigation system to determine a driving path for the autonomous vehicle. For example, the navigation system may determine a series of speeds and directional headings to affect movement of the autonomous vehicle along a path that substantially avoids perceived obstacles while generally advancing the autonomous vehicle along a roadway-based path leading to an ultimate destination. The destination may be set according to user inputs via user interface system 113. The navigation system may update the driving path dynamically while the autonomous vehicle is in operation. The navigation system can incorporate data from a GPS system and one or more maps so as to determine the driving path for the autonomous vehicle.

Data capture module 308 can capture a first set of data that includes a control command issued by an autonomous vehicle controller, for example, at a controller channel. This data represents the initial control command, without time delay or dampening. The data capture module can capture a second set of data that includes a downstream control response, e.g., at a chassis channel of the ADV. The control response can be a sensed response of the ADV to the control command. The sensed response can be position sensors or other sensors that indicate a response of the control command. The captured data may be stored in data log 313, which can be analyzed subsequently, for example, by data analytics system 103 to generate a latency model for determining latency of a particular vehicle or particular type of vehicles.

Referring to FIG. 4, a process 400 is shown that can identify actuation latency of vehicles. The actuation latency can be modeled by a dynamic system to determine a latency model, as described herein. These models are then deployed into a simulation that features controls of a virtual ADV that has actuation latency resembling that of a physical ADV.

At block 402, the process includes capturing first data that includes a control command output by an autonomous vehicle controller of the ADV. At block 404, the process includes capturing second data that includes the control command being implemented at a control unit of the ADV, the control command being implemented to affect movement of the ADV. At block 406, the process includes determining a latency model based on comparing the first data with the second data, the latency model defining a time delay and/or amplitude difference between the control command in the first data and the control command in the second data. At block 408, the process includes applying the latency model in a virtual driving environment. Thus, the process 400 can improve ADV test simulations by including real world latency in the simulations.

Figure 5:
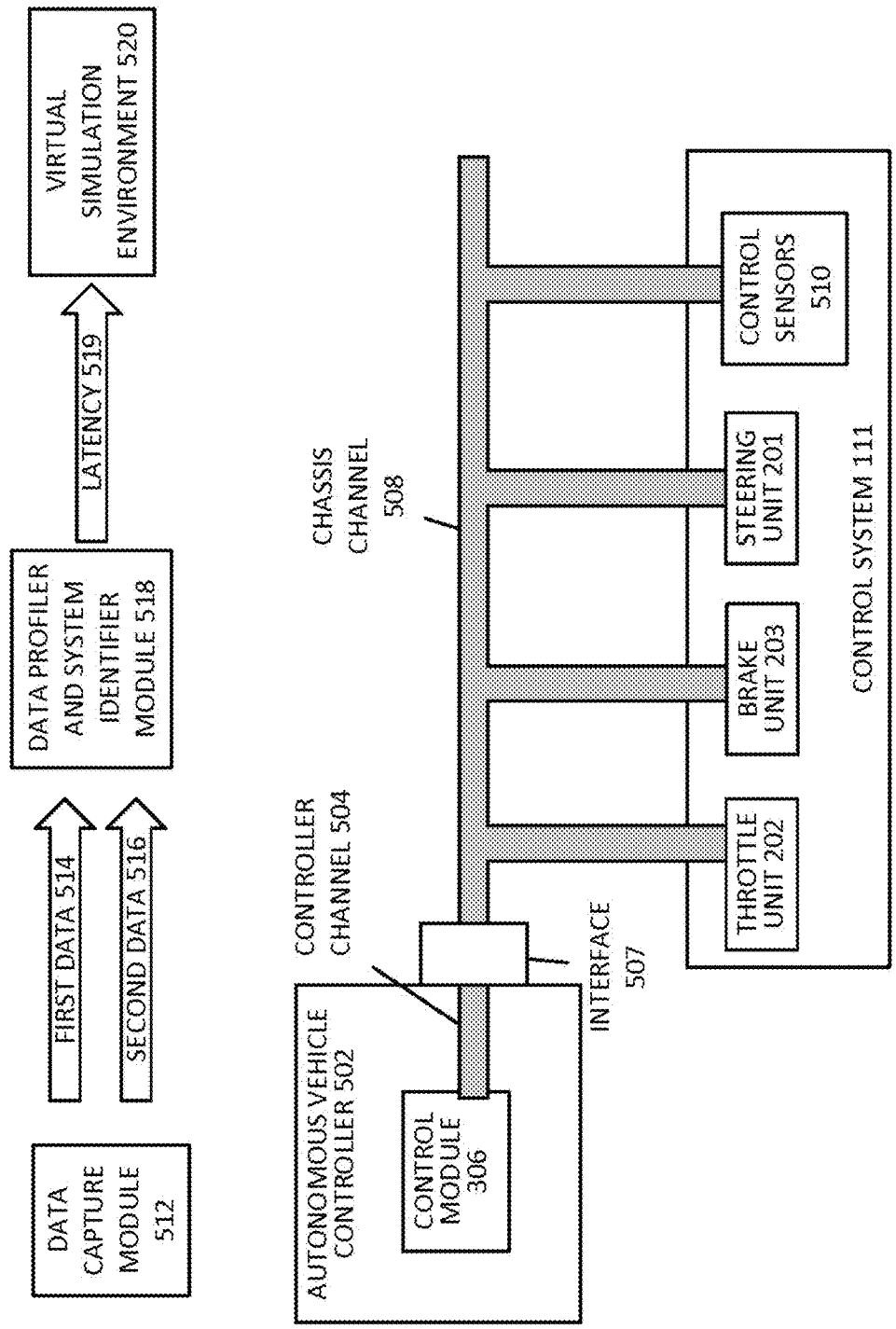
FIG. 5 shows a block diagram and system for determining a latency model and simulating an ADV with the latency model according to one embodiment.

In FIG. 5, an autonomous vehicle controller 502 of an ADV can include various ADV modules such as those shown in perception and planning system 110 (see, for example, FIG. 3A). A control module 306 of the autonomous vehicle controller can issue a control command to a control unit of the control system 111, such as an electronic control unit or ECU of a vehicle. The control command can be issued through a controller channel 504. The control channel 504 can be a suitable known communication bus, including hardware and software, used to communicate analog and/or digital data, for example, Ethernet, TCP/IP, Wi-Fi, IEEE 802.3-2018 or variations thereof, and other equivalent technologies.

Dependent upon the type of the vehicle, there is always a delay in timing between issuing a control command from an autonomous driving system and receiving or executing the control command at the vehicle platform. Such a delay may significantly affect the decision making of the autonomous driving system, which may cause an accident if such a delay is not taken into consideration during planning and control of the autonomous driving system.

The control command (e.g., steering command, a braking command, or a throttle command) can be value (e.g., '0.5, 1, 50, or 99') or a percent (e.g., 50% or 90%) that represents how much a control unit (e.g., throttle unit 202, brake unit 203, and steering unit 201) should be actuated. Depending on the type of control command, the respective steering unit 201, braking unit 203, or throttle unit 202 can respond proportionately. It should be understood that a 'throttle unit' is not limited to internal combustion units, but can also apply as an acceleration command for an electric motor controller and/or a hybrid motor/engine solution.

Control system sensors 510 can sense how much the respective control unit is physically changed based on the command. For example, if the brake is commanded at 30%, control sensors 510 might sense a time delay of 0.05 seconds and a brake response at only 28%. Thus, there is a time delay and a potential difference in amplitude between that which is commanded and how the control unit has responded. In some cases, this amplitude can be zero, while in other cases it can be non-zero.

A time delay can be due to communication latency in the controller channel, the chassis channel 508, or an interface 507. Interface 507 can include communication hardware such as processors and communication buses that can translate the control command from controller channel 504 to a recognizable format on chassis channel 508. In some embodiments, chassis channel 508 is a CAN bus or some known variation of a CAN bus. Other vehicle systems, for example, headlights, sensors, windshield wiper controls, etc, can also be communicatively connected to the chassis channel 508, although not shown in FIG. 5.

A data capture module 512 can capture first data 514 that includes the control command output by the autonomous vehicle controller 502 (e.g., through control module 306). This first data can be captured by recording data on the controller channel 504.

Similarly, the second data 516 can be captured by recording data on chassis channel 508. Second data can include the control command being implemented at the control unit, which includes recorded data on a communication bus of the ADV that facilitates communication to the control unit. The chassis channel can contain the control command being commanded to a control unit (with some latency due to transmission delays from the ADV controller. The chassis channel can also have sensed action (actuation data) of the respective control units (e.g., how much a steering unit has responded to a steering command, a response of an engine or motor to the throttle, or a response of a brake to a brake command).

A data profiler and system identifier 518 can compare first data with the second data to characterize the difference, if any, between the two. This characterization, or latency model, can include a curve, an equation, an equation that defines a curve, one or more coefficients, an impulse response, or a transfer function that, when applied to the first data (e.g., the initial control command), results in an approximation of the second data (e.g., the response of the ADV to the control command). The latency model can be compared to the chassis channel data, repeatedly, to tune the latency model.

Figure 6:
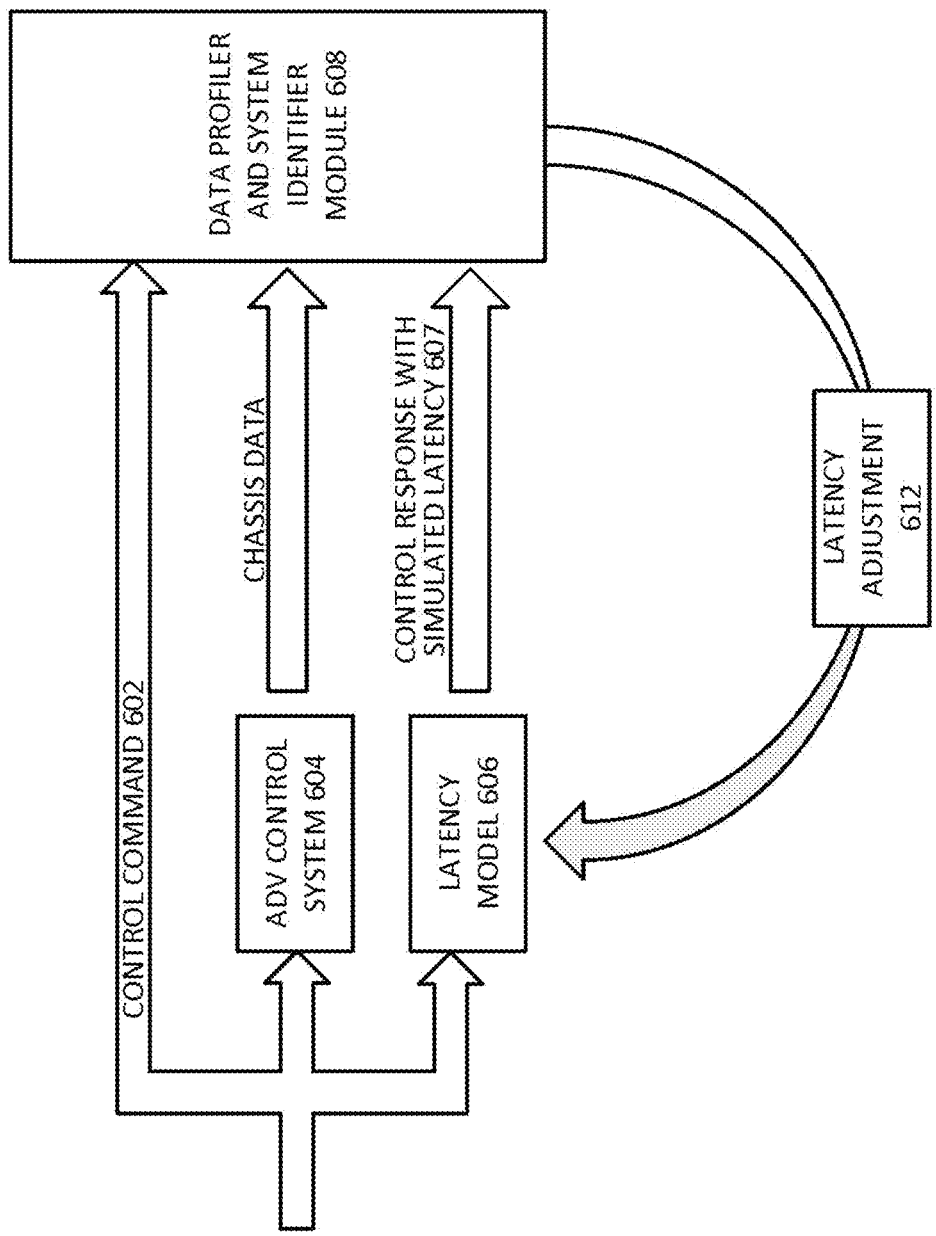
FIG. 6 shows a blog diagram and system for determining a latency model according to one embodiment.

For example, referring to FIG. 6, a control command 602 can be fed as input to ADV control system 604, resulting in chassis data that includes a sensed response of the ADV, to the control command. The ADV control system here can be a physical ADV control system such as a steering unit, throttle unit, or braking unit. Sensors of the ADV can generate data that shows how the ADV responds to the control command. For example, a sensed heading can indicate a response of the ADV to a steering command. A sensed speed, over time, can indicate a response of the ADV to throttle and braking commands.

The latency model 606 is applied to the control command to generate a simulated control response of the ADV with simulated latency and/or dampening. The simulated control response is compared to the chassis data to determine a difference between the simulated control response and sensed control response in the chassis data. This difference can be calculated through subtraction and/or division. A latency adjustment 612 can be determined based on the difference. The latency model can be updated according to the latency adjustment, to better approximate the real latency of the ADV control system 604. This process can be repeated to tune the latency model.

The data profiler and system identifier can, in some embodiments, use a low pass filter to simulate step response latency of an ADV control unit (e.g., steering, throttle, or braking). Configurable parameters of the low pass filter can include dead time or time delay (td), and setting time or response delay. A transfer function (frequency domain) can be characterized as $$\frac{C(s)}{R(s)} = \frac{K}{\tau s + 1} e^{-st_d}$$

where $t_d$ is dead time or time delay, K is a constant, and $\tau_s$ is correlated with setting time. The filter can be represented in the time domain by function:

$$c(t) = K\left(1 - e^{-\frac{\delta(t-t_d)}{\tau}}\right) u(t)$$

where u(t) is the control command, c(t) is the control data (e.g., the response) found in the chassis channel, and $\delta$ is a delta function, such that $\delta(t-t_d)=0$, if $t \leq t_d$ and $\delta(t-t_d)=1$, if $t > t_d$.

The filter can be represented in a discrete system as well:

$$c(k) = K\left(1 - e^{-\frac{\delta(k-k_d)}{\tau}}\right) u(k)$$

where k represents a discrete sample or point, $\delta(k-k_d)=0$, if $k \leq k_d$, and $\delta(k-k_d)=1$, if $k > k_d$.

Therefore, the latency model can include a filter, such as:

$$K\left(1 - e^{-\frac{\delta(t-t_d)}{\tau}}\right)$$

in the time domain, or $$K\left(1 - e^{-\frac{\delta(k-k_d)}{\tau}}\right)$$

in a discrete system, that when applied to a control command, approximates the control response of the ADV.

Figure 7:
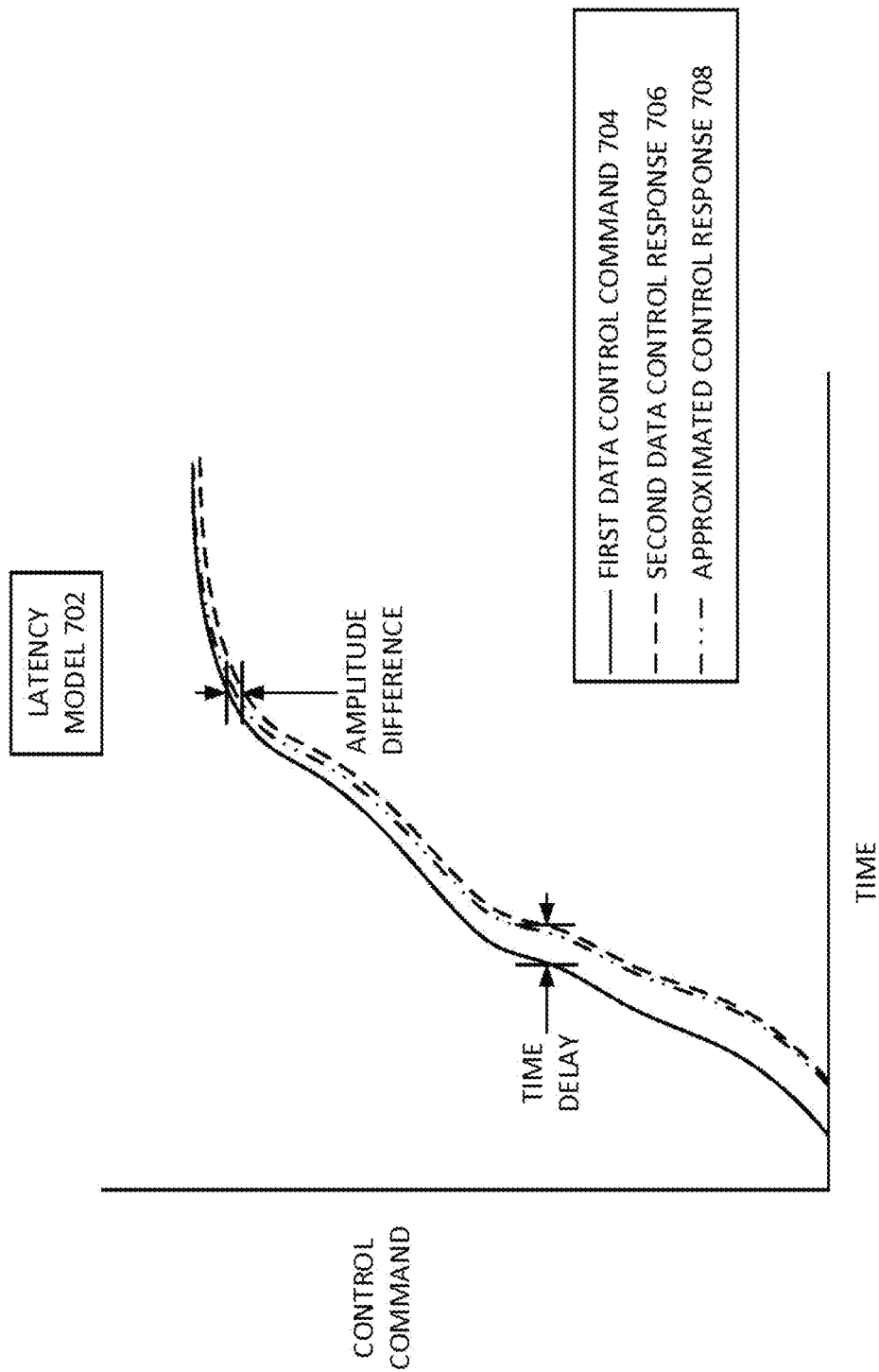
FIG. 7 illustrates an example application of a latency model to a control command.

As mentioned, the latency model, can include a curve, an equation, an equation that defines a curve, one or more coefficients, an impulse response, a filter, and/or a transfer function that, when applied to the first data, results in an approximation of the second data. For example, referring to FIG. 7, a control command 704 is shown in first data that is captured at a control channel. Second data shows a control response 706 that is captured at a chassis channel. A latency model 702 can be applied to the first data 704 to result in an approximated control response 708 that resembles the real control response 706 as found in the second data. As shown, time delay and amplitude difference (e.g., dampening) can vary with respect to time, rate of increase of a control command, a type of control command, and/or control command value). For example, time delay and amplitude difference can be greater for steering than for throttle. Time delay and amplitude differences can be greater for abrupt changes in throttle than for gradual changes. Further, time delay and amplitude differences can vary differently with respect to where the steering angle is. These are non-exhaustive examples of how time delay and amplitude can vary.

Figure 8:
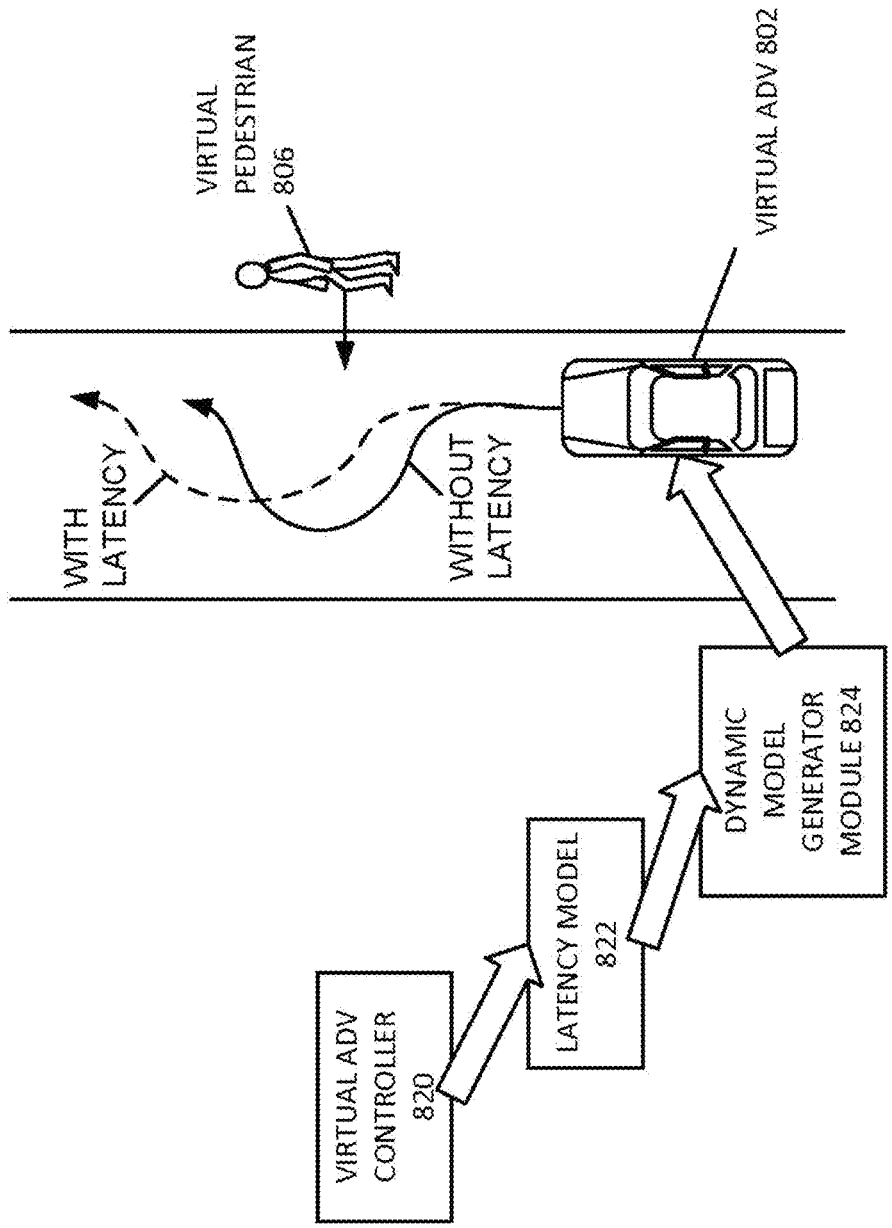
FIG. 8 illustrates a virtual simulation environment with the latency model applied according to one embodiment.

Referring to FIG. 8, a virtual simulation environment can be generated that uses latency model 822 to simulate real ADV latency. As mentioned, simulations help test how various ADV algorithms and modules will respond and perform in different driving scenarios. The virtual simulation environment can include a virtual ADV controller 820 that includes one or more of the ADV driving systems described in FIGS. 1-3B. A dynamic model 824 can simulate movement of virtual objects such as, but not limited to, a virtual ADV 802, and virtual pedestrian 806, in the virtual simulation environment. The virtual ADV controller can generate a virtual control command (e.g., a steering command, a throttle command, or braking command) to control the virtual ADV. Rather than routing this control command directly to the dynamic model 824 to affect a movement of the virtual ADV, the latency model 822 is first applied to the control command. This adds a virtual latency to the simulation to better model real world response of the ADV.

Different simulations can test different scenarios. Each scenario can have a set of pre-defined controls, for example, an initial heading, and speed of the different objects (including the ADV). The simulation can test logic and response of the driving modules (as described with respect to FIGS. 1-3B) in the different scenarios. For example, a scenario might test how the ADV 802 reacts to a pedestrian 806 that wanders onto a road, and in the ADV's driving path. The ADV may try to steer around the pedestrian to avoid the pedestrian. In such a case, the latency model 822 can add a realistic latency to the simulation, to provide improved data as to whether or not the ADV reacts to the pedestrian sufficiently to reduce risk of contact with the pedestrian.

As shown in FIG. 8, the latency model can be applied to a virtual steering control generated by the virtual controller 820. The latency model can add time delay and/or dampening to the steering control, which can then be processed by the dynamic model 824 to generate movement of the virtual ADV. A path of the virtual ADV is shown without latency, and with latency added. Thus, in close cases, a simulation could potentially show satisfactory results of an ADV to a particular scenario without latency. With latency added, however, the same scenario may indicate that the ADV's response did not provide sufficient results, for example, risk of contact with the pedestrian is unacceptably high. Thus, the simulation with added latency provides an improved understanding of how an ADV will perform in the real world.

It should be understood that FIG. 8 is meant to illustrate one example of a simulated ADV scenario. Other scenarios can include how the ADV responds to other objects, such as, but not limited to, other vehicles on the road, pedestrians, and static obstacles such as debris in the road. Some scenarios can test a mix of such obstacles. Other obstacles can test how the ADV responds to different traffic rules and traffic control objects such as stop signs, traffic lights, and more.

Figure 9:
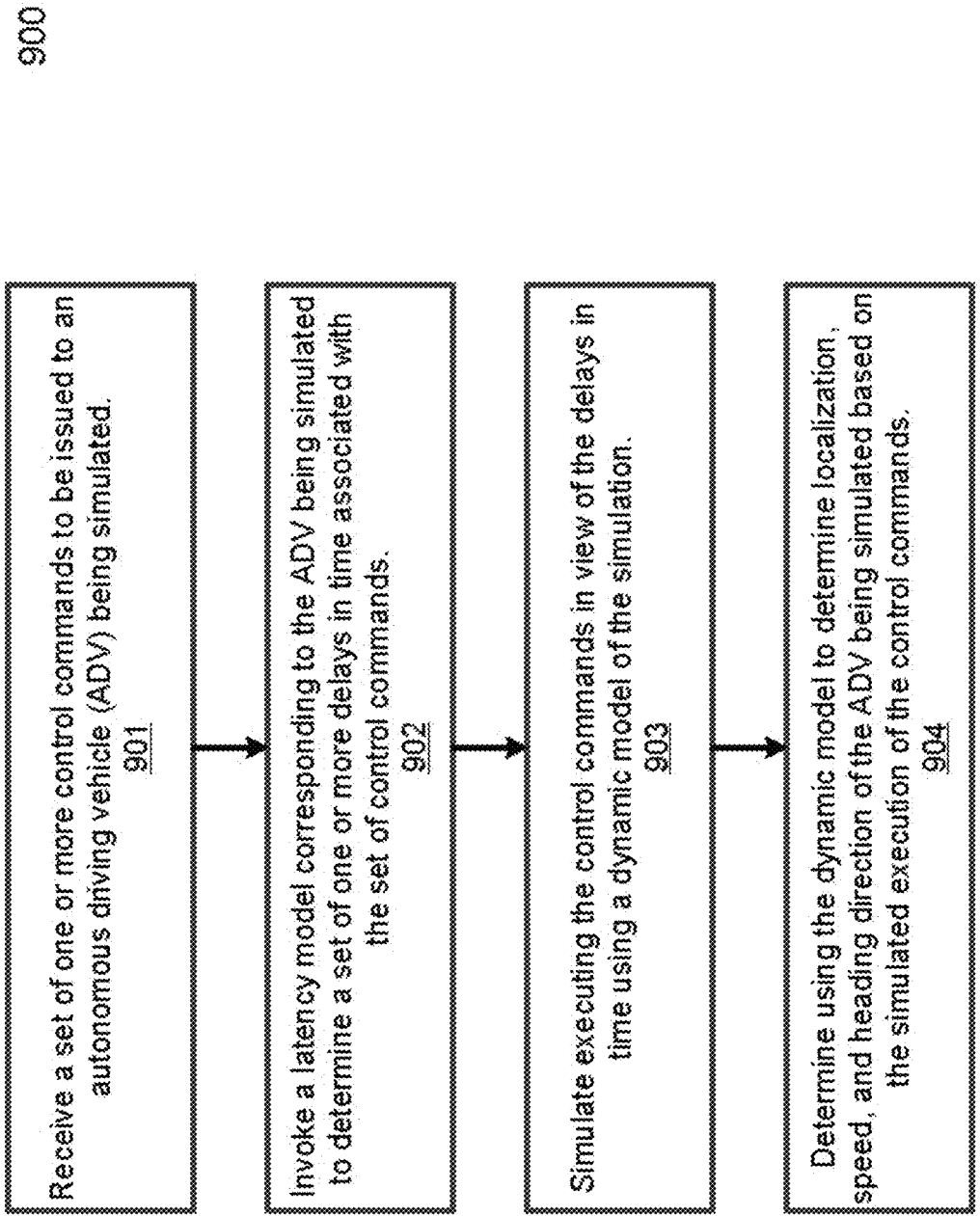
FIG. 9 is a flow diagram illustrating an example of a process of simulating autonomous driving according to one embodiment.

FIG. 9 is a flow diagram illustrating an example of a process of simulating autonomous driving according to one embodiment. Process 900 may be performed by a dynamic model of an autonomous driving simulation system. Referring to FIG. 9, at block 901, a set of control commands (e.g., steering, throttle, brake commands) is received to be issued to an ADV to be simulated. At block 902, a latency model is invoked to determine the delays associated with the control commands. Note that the different control commands may be associated with different delays. At block 903, the control commands are executed in a simulated fashion in view of the corresponding delays. At block 904, the localization, speed, and heading direction of the ADV being simulated are determined using a dynamic model of the simulated autonomous driving system.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A method for simulating driving of an autonomous driving vehicle (ADV), comprising:
    capturing first data that includes a control command output by an autonomous vehicle controller of the ADV and timing of outputting the control command, wherein the control command was generated using an autonomous driving algorithm;
    capturing second data that includes the control command being implemented at a control unit of the ADV and timing of the implementation, the control command being implemented to affect movement of the ADV; and
    determining a latency model based on comparing at least timing of the first data with the second data, the latency model defining time delay between the first data and the second data and the latency model defining an amplitude difference between the first data and the second data, wherein the latency model is utilized to simulate the autonomous driving algorithm in a virtual driving environment.

2. The method of claim 1, further comprising:
obtaining a control command from a communication bus of the ADV;
applying the latency model to the control command to generate a simulated control response of the ADV;
obtaining a sensed ADV response to the control command from the communication bus of the ADV;
determining latency adjustment based on a difference between the simulated control response and the sensed ADV response to the control command; and
updating the latency model according to the latency adjustment.

3. The method of claim 1, wherein generating the virtual driving environment includes
generating a virtual control command to simulate movement of a virtual ADV; and
applying the latency model to the virtual control command to affect a virtual latency in the simulated movement of the virtual ADV.

4. The method of claim 1, wherein the latency model includes one or more of the following: a curve, an equation, an equation that defines a curve, one or more coefficients, an impulse response, or a transfer function that, when applied to the first data, results in an approximation of the second data.

5. The method of claim 1, wherein the control command is a steering command.

6. The method of claim 1, wherein the control command is a brake command.

7. The method of claim 1, wherein the control command is a throttle command.

8. The method of claim 1, wherein the control unit is a steering unit, a brake unit, a throttle unit, or a motor controller.

9. The method of claim 1, wherein capturing the second data having the control command being implemented at the control unit includes sensing an action of the control unit.

10. The method of claim 1, wherein capturing the second data having the control command being implemented at the control unit includes recording data on a communication bus of the ADV that facilitates communication to the control unit.

11. A data processing system, comprising:
one or more processors; and
memory coupled to the one or more processors to store instructions, which when executed by the one or more processors, cause the one or more processors to perform operations comprising:
capturing first data that includes a control command output by an autonomous vehicle controller of an autonomous driving vehicle (ADV) and timing of outputting the control command, wherein the control command was generated using an autonomous driving algorithm;
capturing second data that includes the control command being implemented at a control unit of the ADV and timing of the implementation, the control command being implemented to affect movement of the ADV; and
determining a latency model based on comparing at least timing of the first data with the second data, the latency model defining time delay between the first data and the second data and the latency model defining an amplitude difference between the first data and the second data, wherein the latency model is utilized to simulate the autonomous driving algorithm in a virtual driving environment.

12. The data processing system of claim 11, further comprising:
obtaining a control command from a communication bus of the ADV;
applying the latency model to the control command to generate a simulated control response of the ADV;
obtaining a sensed ADV response to the control command from the communication bus of the ADV;
determining latency adjustment based on a difference between the simulated control response and the sensed ADV response to the control command; and
updating the latency model according to the latency adjustment.

13. The data processing system of claim 11, wherein generating the virtual driving environment includes
generating a virtual control command to simulate movement of a virtual ADV; and
applying the latency model to the virtual control command to affect a virtual latency in the simulated movement of the virtual ADV.

14. The data processing system of claim 11, wherein the latency model includes one or more of the following: a curve, an equation, an equation that defines a curve, one or more coefficients, an impulse response, or a transfer function that, when applied to the first data, results in an approximation of the second data.

15. The data processing system of claim 11, wherein capturing the second data having the control command being implemented at the control unit includes recording data on a communication bus of the ADV that facilitates communication to the control unit.

16. A non-transitory machine-readable medium having instructions stored therein, which when executed by a processor, cause the processor to perform operations comprising:
capturing first data that includes a control command output by an autonomous vehicle controller of an autonomous driving vehicle (ADV) and timing of outputting the control command, wherein the control command was generated using an autonomous driving algorithm;
capturing second data that includes the control command being implemented at a control unit of the ADV and timing of the implementation, the control command being implemented to affect movement of the ADV; and
determining a latency model based on comparing at least timing of the first data with the second data, the latency model defining time delay between the first data and the second data and the latency model defining an amplitude difference between the first data and the second data, wherein the latency model is utilized to simulate the autonomous driving algorithm in a virtual driving environment.

17. The non-transitory machine-readable medium of claim 16, further comprising:
obtaining a control command from a communication bus of the ADV;
applying the latency model to the control command to generate a simulated control response of the ADV;
obtaining a sensed ADV response to the control command from the communication bus of the ADV;
determining latency adjustment based on a difference between the simulated control response and the sensed ADV response to the control command; and
updating the latency model according to the latency adjustment.

18. The non-transitory machine-readable medium of claim 16, wherein generating the virtual driving environment includes
- generating a virtual control command to simulate movement of a virtual ADV; and
- applying the latency model to the virtual control command to affect a virtual latency in the simulated movement of the virtual ADV.

19. The non-transitory machine-readable medium of claim 16, wherein the latency model includes one or more of the following: a curve, an equation, an equation that defines a curve, one or more coefficients, an impulse response, or a transfer function that, when applied to the first data, results in an approximation of the second data.

20. The non-transitory machine-readable medium of claim 16, wherein capturing the second data having the control command being implemented at the control unit includes recording data on a communication bus of the ADV that facilitates communication to the control unit.

\* \* \* \* \*